United States Patent
Kofuji et al.

(10) Patent No.: US 8,093,529 B2
(45) Date of Patent: Jan. 10, 2012

(54) CONTROL METHOD OF A TEMPERATURE OF A SAMPLE

(75) Inventors: Naoyuki Kofuji, Tama (JP); Tsunehiko Tsubone, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 565 days.

(21) Appl. No.: 12/194,019

(22) Filed: Aug. 19, 2008

(65) Prior Publication Data

US 2009/0310645 A1    Dec. 17, 2009

(30) Foreign Application Priority Data

Jun. 16, 2008   (JP) ................................. 2008-156859

(51) Int. Cl.
*B23K 10/00* (2006.01)
(52) U.S. Cl. ......... 219/121.54; 219/121.43; 219/121.41; 219/497; 118/724; 438/715; 156/345.52
(58) Field of Classification Search ............. 219/121.43, 219/121.44, 121.54, 121.57, 497, 121.58, 219/121.59; 118/723 I, 723 R, 724, 725; 156/345.51, 345.52, 345.53
See application file for complete search history.

(56) References Cited

U.S. PATENT DOCUMENTS

| | | | | |
|---|---|---|---|---|
| 4,971,653 A | * | 11/1990 | Powell et al. | 438/5 |
| 5,989,929 A | * | 11/1999 | Nikoh et al. | 438/9 |
| 6,320,737 B1 | * | 11/2001 | Hirano et al. | 361/234 |
| 6,387,798 B1 | * | 5/2002 | Loke et al. | 438/623 |
| 6,508,885 B1 | * | 1/2003 | Moslehi et al. | 118/728 |
| 6,921,724 B2 | * | 7/2005 | Kamp et al. | 438/715 |

FOREIGN PATENT DOCUMENTS

JP   2005-522051   7/2005

* cited by examiner

*Primary Examiner* — Mark H Paschall
(74) *Attorney, Agent, or Firm* — Antonelli, Terry, Stout & Kraus, LLP.

(57) ABSTRACT

A method of stably controlling the temperature of a sample placed on a sample stage to a desired temperature by estimating a sample temperature accurately, the sample stage including a refrigerant flow path to cool the sample stage, a heater to heat the sample stage, and a temperature sensor to measure the temperature of the sample stage. This method comprises the steps of: measuring in advance the variation-with-time of supply electric power to the heater, temperature of the sample, and temperature of the temperature sensor, without plasma processing; approximating the relation among the measured values using a simultaneous linear differential equation; estimating a sample temperature from the variation-with-time of sensor temperature $y_1$, heater electric power $u_1$, and plasma heat input by means of the Luenberger's states observer based on the simultaneous linear differential equation used for the approximation; and performing a feedback control of sample temperature using the estimated sample temperature.

20 Claims, 13 Drawing Sheets

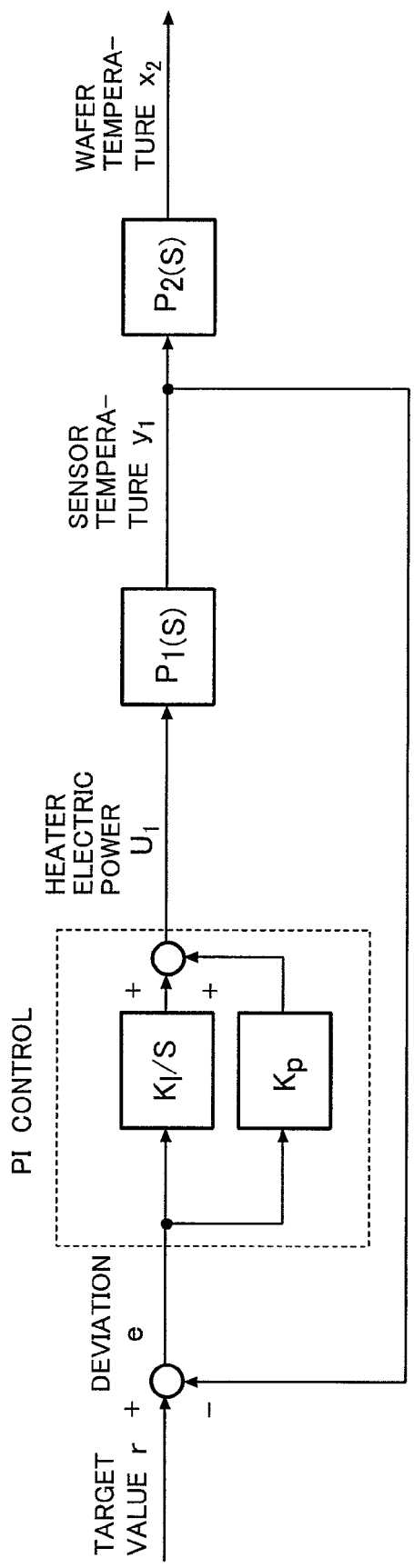

CONTROL METHOD OF A TEMPERATURE OF A SAMPLE

BACKGROUND OF THE INVENTION

1. Field of the Invention

The present invention relates to a sample temperature control method, and more specifically relates to a method of temperature control in a plasma processing apparatus.

2. Description of the Related Art

FIG. 18 is a diagram illustrating a conventional method of adjusting sample temperatures. As shown in FIG. 18, a sample is placed on a sample stage 10 cooled by a refrigerant. The sample stage has an embedded heater 13 and is configured to regulate an amount of heat by regulating the electric power to be supplied to the heater 13. Furthermore, the sample stage has an embedded temperature sensor 15 capable of measuring a temperature of the sample stage 10 (refer to Japanese Unexamined Patent Application Publication No. 2005-522051 and its corresponding U.S. Pat. No. 6,921,724).

FIG. 19 is a diagram illustrating a conventional temperature control apparatus. As shown in drawing, the apparatus employs a feedback control method for electric power $u_1$ to be supplied to the heater so that measurement value $y_1$ of the temperature sensor becomes a target value r. Also, the PI control is commonly used as a feedback control method. In recent years, a structure wherein the sample stage is divided into three regions: center, edge, and middle, each having a heater and a temperature sensor has been realized.

SUMMARY OF THE INVENTION

In the conventional method described above, it is possible to quickly control the temperature of a sample stage. However, (1) heat transfer between the sample stage and a sample placed thereon is not sufficient. Therefore, it takes a long time for wafer temperature to reach a desired value. Also, (2) as described above, in a case where the sample stage is divided into several regions and wafer temperature is controlled for each region, the temperature gradient of the wafer may decrease due to heat transfer of the wafer itself when sloping wafer temperature while differing set values of sensor temperature. In such a case, wafer temperature distribution will not agree with temperature distribution of the sample stage. In addition, (3) during the actual etching process the wafer is heated by a heat input from a plasma. Due to this, wafer temperature rises above a target temperature.

In the conventional method described above, it is possible to quickly control the temperature of a sample stage. However, (1) heat transfer between the sample stage and a sample placed thereon is not sufficient. Therefore, it takes a long time for wafer temperature to reach a desired value. Also, (2) as described above, in a case where the sample stage is divided into several regions and wafer temperature is controlled for each region, the temperature gradient of the wafer may decrease due to heat transfer of the wafer itself when sloping wafer temperature while differing set values of sensor temperature. In such a case, wafer temperature distribution will not agree with temperature distribution of the sample stage. In addition, (3) during the actual etching process the wafer is heated by a heat input from a plasma. Due to this, wafer temperature rises above a target temperature.

The present invention has been worked out in view of the problems described above, and therefore an object of the invention is to provide a sample temperature control method capable of stably controlling a wafer temperature so as to attain a desired temperature by estimating a sample temperature accurately.

In order to solve the problems described above, the present invention employs the following means.

A sample temperature control method for controlling the temperature of a sample placed on a sample stage that is disposed in a plasma processing chamber for placing the sample, and has a refrigerant flow path to cool the sample stage, a heater to heat the sample stage, and a temperature sensor to measure a temperature of the sample stage, the method comprising the steps of: measuring in advance, with no plasma processing being performed, the variation-with-time of supply electric power to the sample stage, temperature of the sample, and temperature of the temperature sensor; approximating the relation among these measured values using a simultaneous linear differential equation; estimating a sample temperatures from the variation-with-time of sensor temperature, heater electric power, and plasma heat input by means of the Luenberger's states observer based on the linear simultaneous differential equation used for the approximation; and performing a feedback control of sample temperature using the estimated sample temperatures.

Since the present invention is configured as described above, it is possible to accurately estimate a sample temperature and stably control the sample temperature to a desired temperature.

BRIEF DESCRIPTION OF THE DRAWINGS

Embodiments of the present invention will be described in detail based on the following figures, wherein:

FIG. 19 is a diagram illustrating a conventional temperature control apparatus.

DETAILED DESCRIPTION OF PREFERRED EMBODIMENTS

Figure 5:
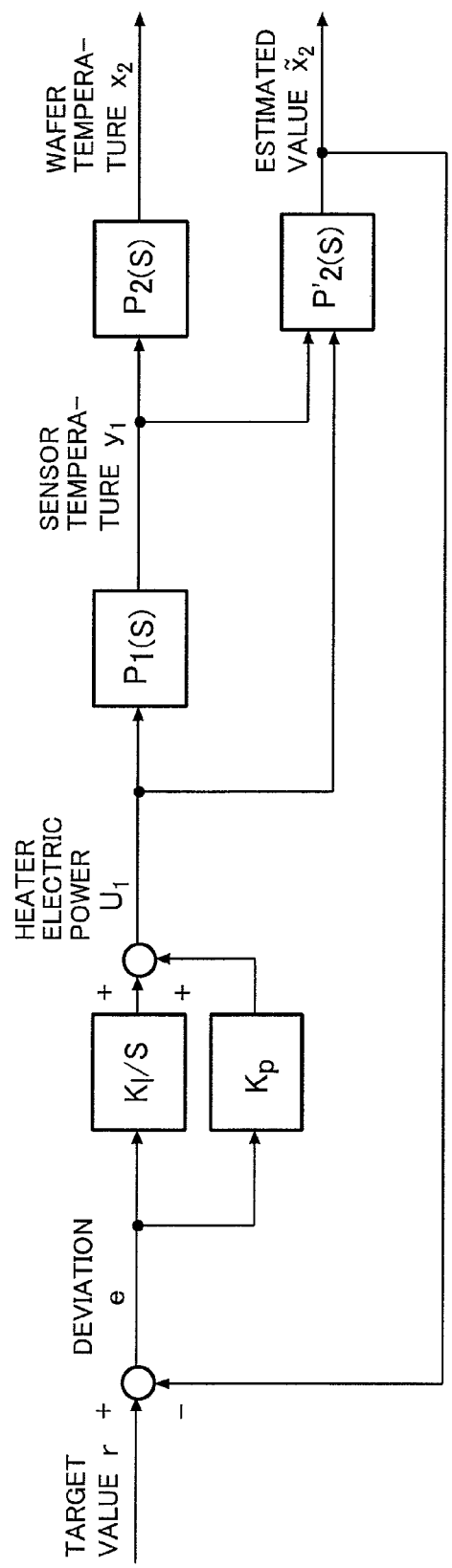
FIG. 5 is a diagram illustrating a temperature control apparatus to be used in the present invention.

Preferred embodiments of the present invention are described below with reference to the accompanying drawings. FIG. 5 is a diagram illustrating a temperature control apparatus to be used in the present invention. As shown in FIG. 5, a continuously varying wafer temperature $x_2$ is estimated from the variation-with-time of sensor temperature $y_1$ and heater electric power $u_1$, and then the estimated value ($\tilde{x}_2$) (a ~ put over x is expressed as ($\tilde{x}$) for convenience) are fed back to heater electric power $u_1$ to control wafer temperature $x_2$. As a wafer temperature estimation method, the following three types of method are used.

Figure 1:
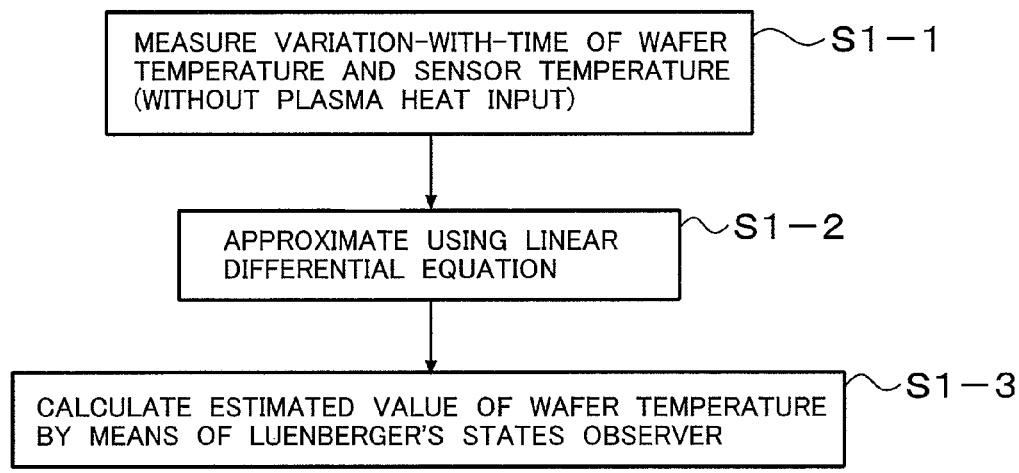
FIG. 1 is a diagram illustrating a first wafer temperature estimation method.

FIG. 1 is a diagram illustrating a first wafer temperature estimation method. In this method, at step S1-1, the variation-with-time of wafer temperature, sensor temperature, and heater electric power is measured by varying the electric power of each heater described below, with a dummy wafer having a temperature measurement mechanism being placed on a sample stage in advance and with plasma being off. At step S1-2, the co-relation among wafer temperature, sensor temperature, and heater electric power is approximated using a linear differential equation. At step S1-3, an estimated value of wafer temperature is calculated from sensor temperature and heater electric power during the processing of an actual sample by means of the Luenberger's states observer using the linear differential equation at step S1-2.

Figure 2:
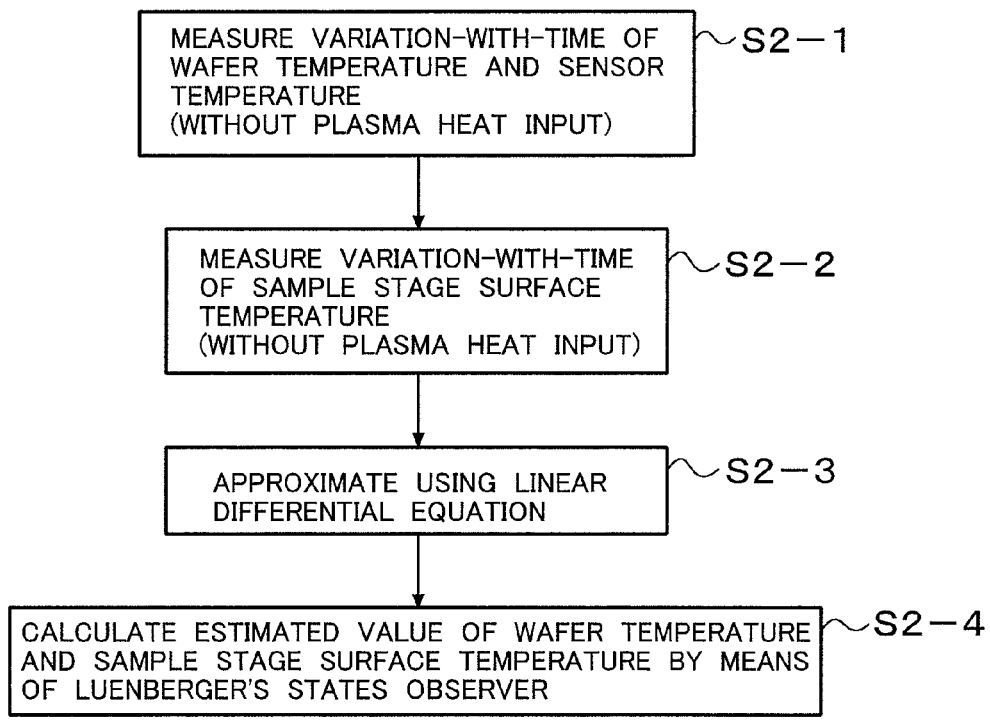
FIG. 2 is a diagram illustrating a second wafer temperature estimation method.

FIG. 2 is a diagram illustrating a second wafer temperature estimation method. First, at step S2-1, the variation-with-time of wafer temperature, sensor temperature, and heater temperature is measured by varying each heater electric power by the same method as in the first method. At step S2-2, a sample stage surface temperature is measured by varying the heater electric power with no sample being placed on the sample stage, in exactly the same way as at step S2-1. At step S2-3, the co-relation among wafer temperature, sensor temperature, heater electric power, and sample stage surface temperature is approximated using a linear differential equation. At step S2-4, estimated values of sample stage surface temperature and wafer temperature are calculated from sensor temperature and heater electric power during the processing of an actual sample by means of the Luenberger's states observer using the linear differential equation at step S2-3.

Figure 3:
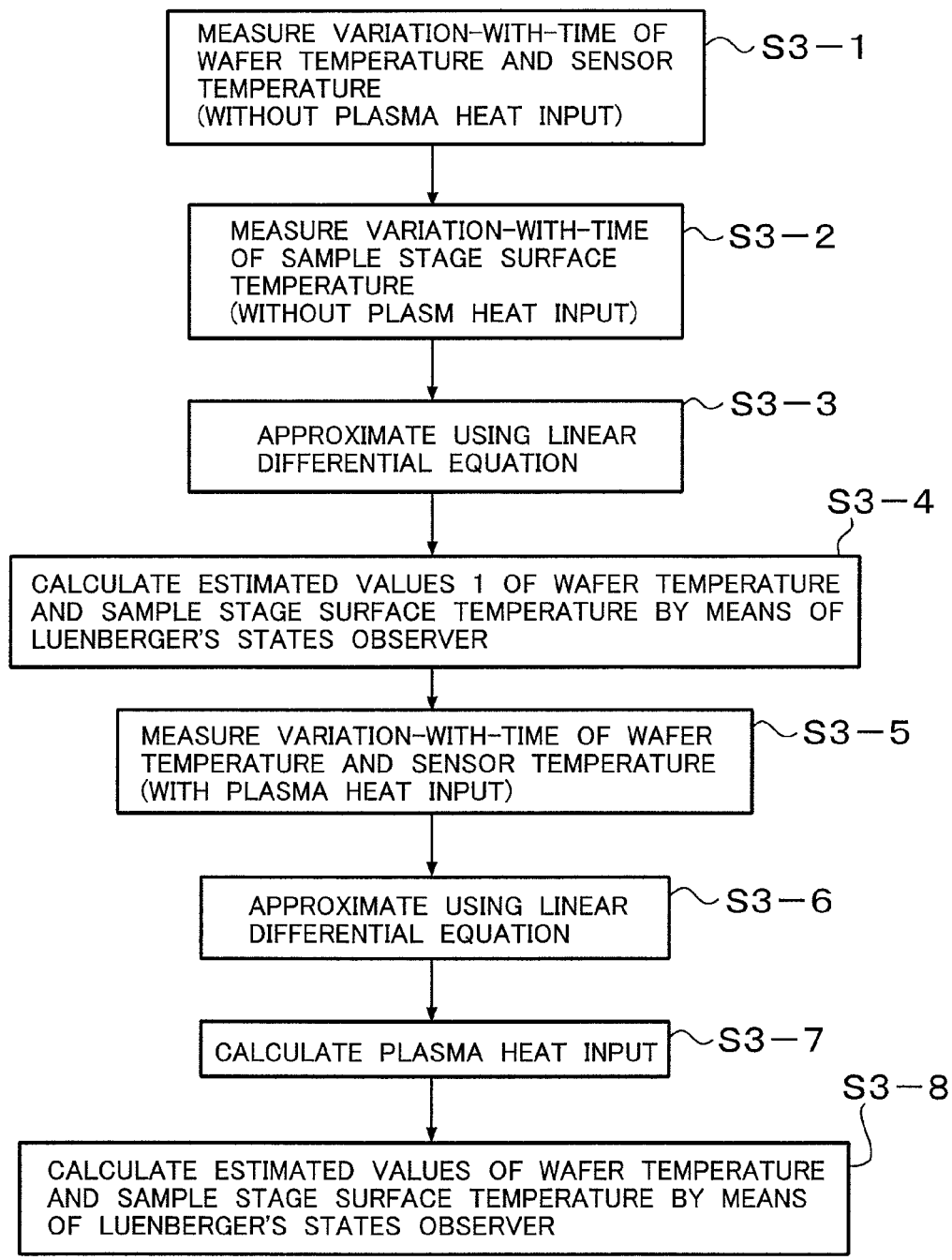
FIG. 3 is a diagram illustrating a third wafer temperature estimation method.

FIG. 3 is a diagram illustrating a third wafer temperature measurement method. At step S3-1 to 3-4, estimated values of sample stage surface temperature and wafer temperature are calculated by the same method as in the second method. These estimated values are designated as sample stage surface temperature estimated value 1 and wafer temperature estimated value 1 respectively. At step S3-5, the variation-with-time of wafer temperature, sensor temperature and heater electric power is measured by varying a plasma heat input condition and heater electric power, with a dummy wafer being placed on the sample stage and with plasma discharge being on. At step S3-6, the correlation among wafer temperature, sensor temperature, heater electric power, plasma heat input, sample stage surface temperature estimated value 1, and wafer temperature estimated value 1 is approximated using a linear differential equation. At step 3-7, plasma heat input under actual process conditions is determined by the method described below. At step S3-8, sample stage surface temperature estimated value 1 and wafer temperature estimated value 1 as well as an estimated value of actual wafer temperature are calculated from the variation-with-time of sensor temperature and heater electric power as well as plasma heat input by means of the Luenberger's states observer using the linear differential equation at step S3-6.

Figure 4:
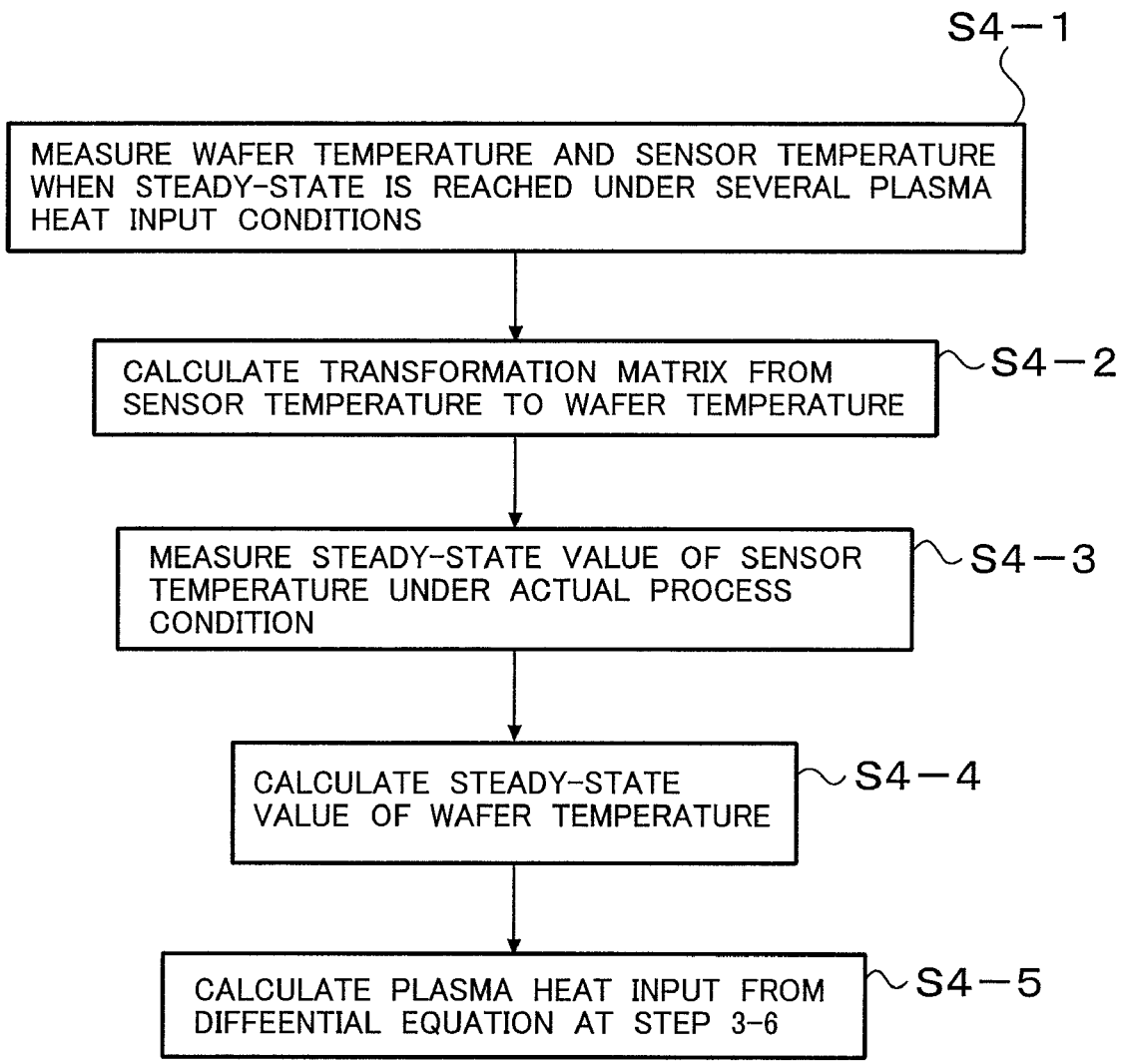
FIG. 4 is a diagram illustrating a method of finding a plasma heat input under actual process conditions.

Now, a method of determining a plasma heat input under actual process conditions is described. FIG. 4 is a diagram illustrating the outline of this method. At step S4-1, wafer temperature and sensor temperature are measured when a steady-state is reached under several plasma heat input conditions, with a dummy sample being placed on the sample stage and with the heater electric power being off. At step S4-2, assuming that the relation between sensor temperature and wafer temperature is linear, a transformation matrix from sensor temperature to wafer temperature is formulated. At step S4-3, a steady-state value of sensor temperature is measured under actual process conditions. At step S4-4, a plasma heat input is calculated from the steady-state value of sensor temperature and the steady-state value of wafer temperature using the linear differential equation at step S306.

Embodiment 1

Figure 6:
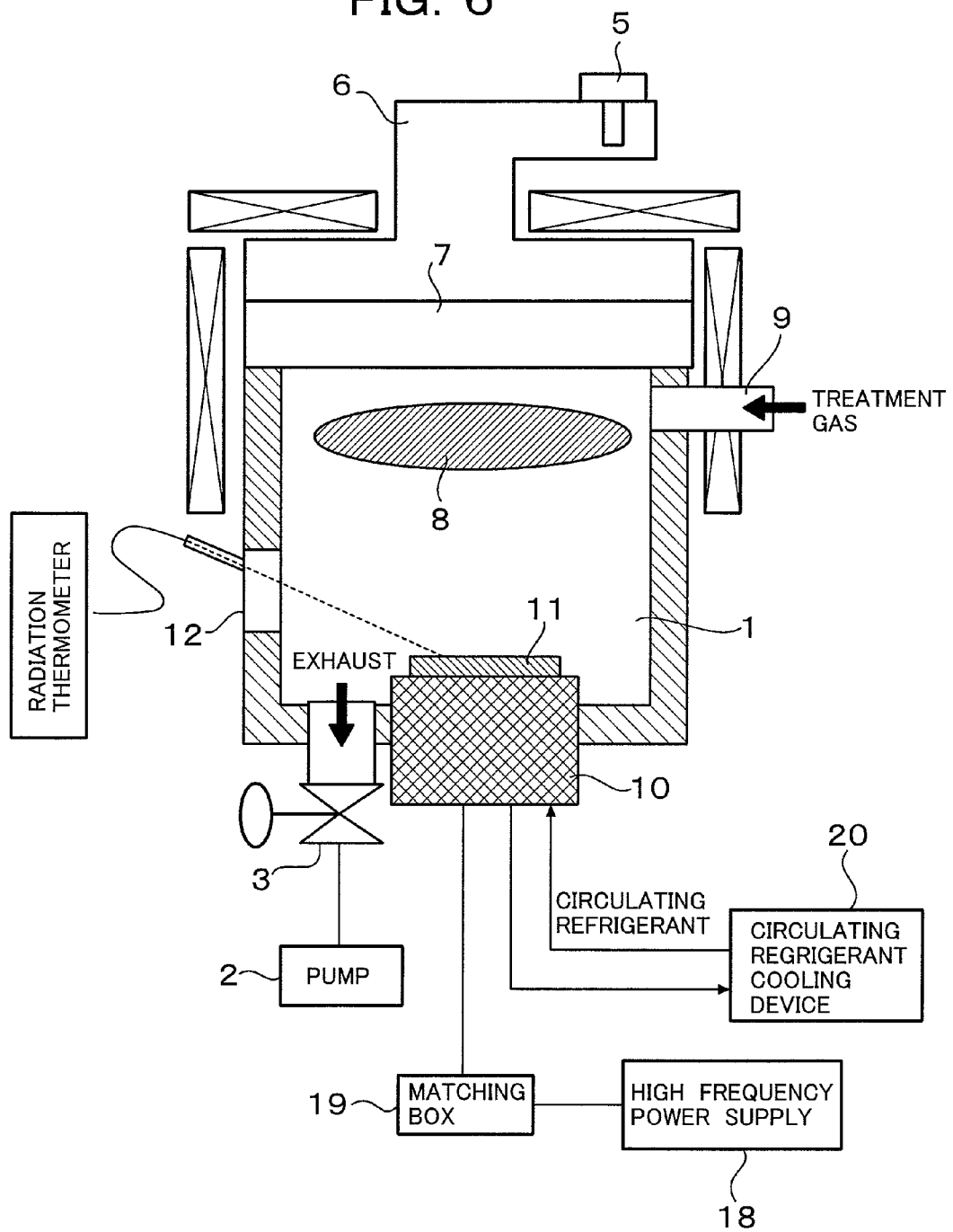
FIG. 6 is a diagram illustrating a microwave plasma etching apparatus.

FIG. 6 is a diagram illustrating a microwave plasma etching apparatus having an automatic wafer temperature control function. In this apparatus, a microwave generated by a magnetron 5 is introduced into a decompression treatment chamber 1 via a wave guide 6 and a quartz window 7 to produce a plasma 8. At this time, a treatment gas introduced from a gas inlet 9 is dissociated by the plasma 8 and radicals and positive ions are produced. Also, a butterfly throttle valve 3 is provided between the decompression treatment chamber 1 and a pump and therefore it is possible to regulate a pressure in the decompression treatment chamber by regulating the degree of opening of the throttle valve 3.

Furthermore, a wafer 11 to be etched is placed on a sample stage 10 connected to a high frequency power supply. By applying an electric power to the sample stage from the high frequency power supply via a matching box, it is possible to generate a negative bias voltage in the wafer. The sample is etched by irradiating to the wafer, ions in the plasma which have been accelerated by a negative bias voltage (hereinafter, this high frequency electric power is referred to as a bias electric power).

Also, a window 12 made of barium fluoride is provided on a side surface of the decompression treatment chamber, and is configured to be capable of measuring a sample stage surface temperature with a radiation thermometer in the absence of a plasma. Furthermore, this apparatus has a circulating refrigerant cooling device configured to cool the entire sample stage by a refrigerant that is cooled to a certain temperature by the circulating refrigerant cooling device and is circulated between the circulating refrigerant cooling device and the sample stage.

Figure 7:
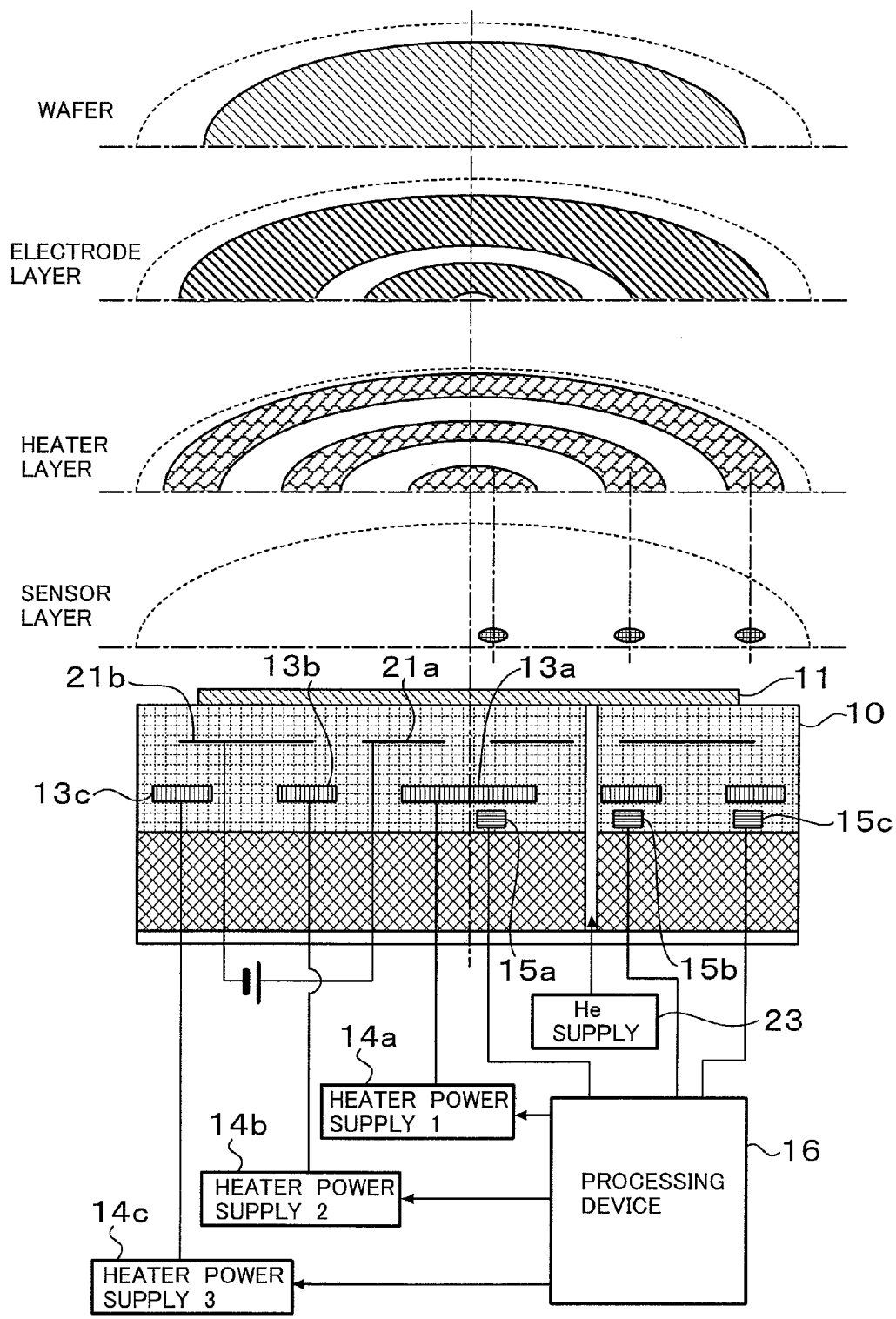
FIG. 7 is a diagram illustrating the details of a sample stage.

FIG. 7 is a diagram illustrating the detail of the sample stage 10. The surface of sample stage 10 is covered with a dielectric film splayed thereon in which a pair of positive and negative ESC electrodes 21a and 21b is embedded so that a wafer 11 is attracted to the sample stage 10 by application of a direct current across the electrodes. Also, the dielectric film has embedded heaters 13a, 13b, and 13c disposed respectively in three regions, center, middle, and edge, for controlling the sample stage temperature distribution, and these regions can be heated independently by respective heater power supplies 14a, 14b, and 14c. Furthermore, temperature sensors 15a, 15b, and 15c are embedded in the respective regions of the dielectric film to measure the temperatures of the center, middle, and edge regions of the sample stage, so that outputs of respective heater power supplies are controlled by a processing device 16 based on the output signals of respective temperature sensors. In addition, He with a certain pressure is filled between the rear surface of a wafer and the sample stage in order to improve the heat transfer between the wafer and the sample stage.

With reference to the etching apparatus shown in FIG. 6, a method of performing a first wafer temperature estimation control is described according to the procedure in FIG. 1.

First, at step S1-1, heater electric power $u_1$ is incrementally increased and then the variation of wafer temperature $x_1$ and the variation of sensor temperature $y_1$ are measured. Specifically, refrigerant temperature is set to 30° C. and He pressure is regulated to 1 kPa, with a dummy wafer having the temperature measuring function being placed on the sample stage and attracted thereto. After a sufficient period of time, when wafer temperature has reached to 30° C., outputs $u_1$ of heater power supplies 14a, 14b, and 14c are increased from 0 W to 1000 W sequentially and the variation-with-time of wafer temperature $x_1$ and sensor temperature $y_1$ for each of the center, middle, and edge regions is measured.

At step S1-2, the relation among wafer temperature $x_1$, sensor temperature $y_1$, and heater electric power $u_1$ is approximated using equation (1). Specifically, the values of respective elements of constant matrices $A_{11}$ to $A_{22}$, $B_{11}$ to $B_{21}$ are determined using the method of least squares.

Equation 1:

$$\frac{d}{dt}\begin{bmatrix} y_1 \\ x_2 \end{bmatrix} = \begin{bmatrix} A_{11} & A_{12} \\ A_{21} & A_{22} \end{bmatrix}\begin{bmatrix} y_1 - T_0 \\ x_2 - T_0 \end{bmatrix} + \begin{bmatrix} B_{11} \\ B_{21} \end{bmatrix} u_1 \qquad (1)$$

$$y_1 = \begin{bmatrix} y_{c1} \\ y_{m1} \\ y_{e1} \end{bmatrix} : Pt\text{ sensor temperature,}$$

$$x_2 = \begin{bmatrix} x_{c2} \\ x_{m2} \\ x_{e2} \end{bmatrix} : \text{Wafer temperature,}$$

$$u_1 = \begin{bmatrix} u_{c1} \\ u_{m1} \\ u_{e1} \end{bmatrix} : \text{Heater electric power,}$$

$$T_0 = \begin{bmatrix} t_0 \\ t_0 \\ t_0 \end{bmatrix} : \text{Preset temperature of refrigerant}$$

Suffixes c, m, and e represent the center, middle, and edge regions respectively.

At step S1-3, wafer temperature is estimated under a desired process condition using the Luenburger's states observer, based on the constant matrix $A_{11}$ to $A_{22}$, $B_{11}$ to $B_{21}$. Specifically, a variable $Z_2$ is defined and then the variation-with-time of $z_2$ is calculated using equation (2).

Equation 2:

$$\frac{dz_2}{dt} = P(z_2 - T_0) + Q(y_1 - T_0) + PL(y_1 - T_0) + Ru_1 \qquad (2)$$

$$P = (A_{22} - LA_{12}),\ Q = (A_{21} - LA_{11}),\ R = (B_{21} - LB_{11})$$

$$z_2 = \begin{bmatrix} z_{c2} \\ z_{m2} \\ z_{e2} \end{bmatrix} : \text{States observer, } L: \text{any matrix of 3 rows} \times 3 \text{ columns}$$

An estimated value ($\tilde{x}_2$) of wafer temperature is determined from the $z_2$ described above using equation (3).

Equation 3:

$$\tilde{x}_2 = z_2 + L(y_1 - T_0) \qquad (3)$$

$$\tilde{x}_2 = \begin{bmatrix} \tilde{x}_{c2} \\ \tilde{x}_{m2} \\ \tilde{x}_{e2} \end{bmatrix} : \text{Estimated value of wafer temperature}$$

If calculated with the L set to an appropriate value, the estimated value ($\tilde{x}_2$) will almost agree with wafer temperature when heat input from a plasma is substantially small. Accordingly, if appropriate PI control is performed with respect to the ($\tilde{x}_2$), quick and accurate wafer temperature control is possible. In this embodiment, unit matrix (4) was used as a value of L.

Equation 4

$$L = \begin{bmatrix} 1 & 0 \\ 0 & 1 \end{bmatrix} \qquad (4)$$

Figure 8:
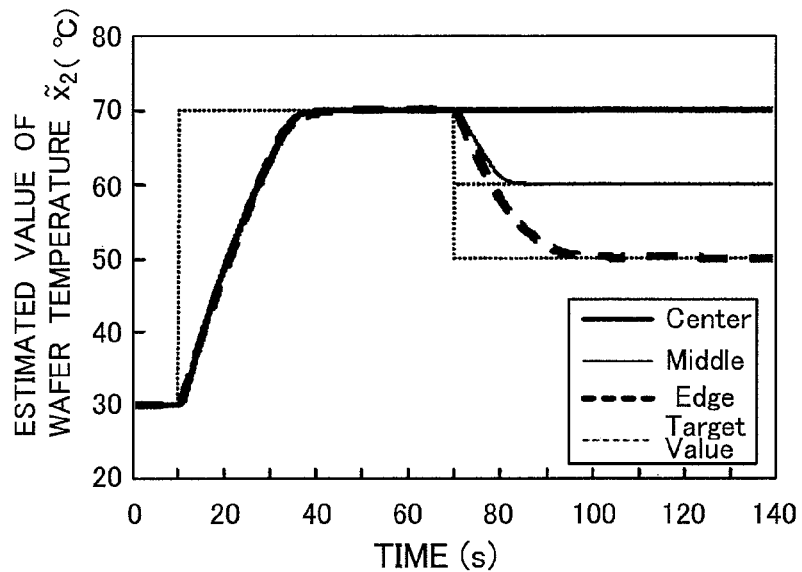
FIG. 8 is a diagram showing the variation of an estimated value of wafer temperature according to the first estimation method.
Figure 9:
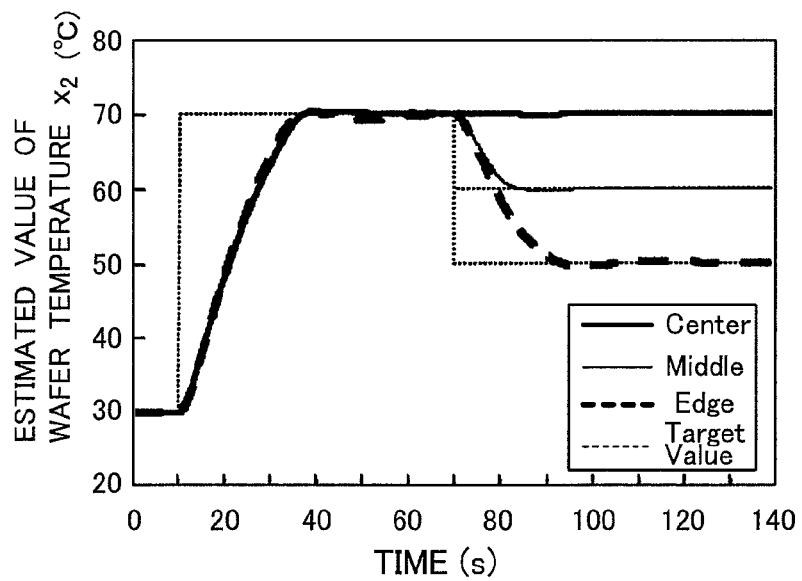
FIG. 9 is a diagram showing the variation of a measured value of wafer temperature according to the first estimation method.

Using this method, heater electric power was controlled by varying sequentially target values of wafer temperatures of the center/middle/edge regions from 30/30/30° C. to 70/70/70° C. and further to 70/60/50° C. respectively. The variation of the estimated value ($\tilde{x}_2$) of wafer temperature at this time is shown in FIG. 8 and the variation of the measured value $x_2$ of wafer temperature is shown in FIG. 9. Since wafer temperature varied with the variation of the estimated value ($\tilde{x}_2$), it is proved that wafer temperature can be controlled to a desired temperature quickly.

Figure 10:
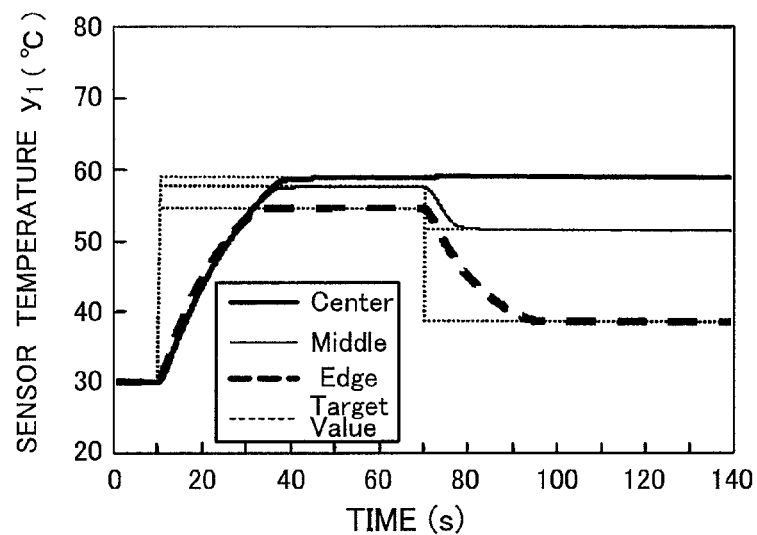
FIG. 10 is a diagram showing the variation of a sensor temperature according to the first estimation method.
Figure 11:
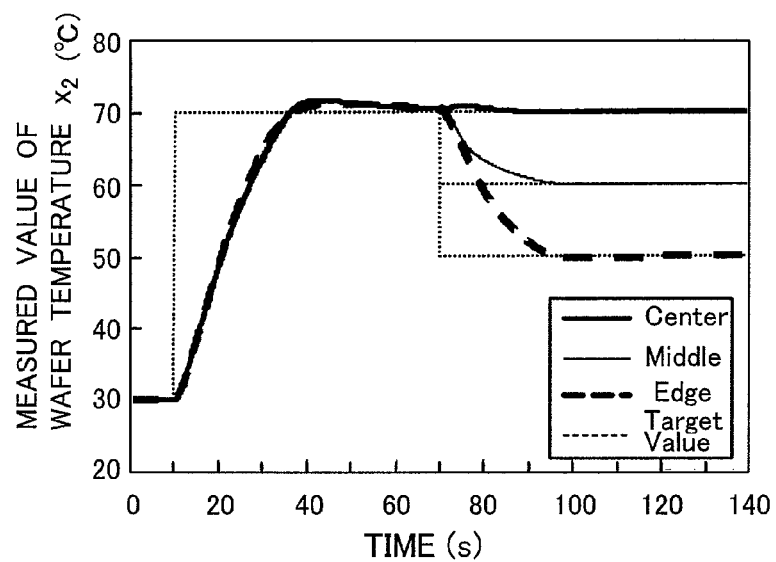
FIG. 11 is a diagram showing the variation of a measured value of wafer temperature according to the first estimation method.

Next, a conventional method of PI control of heater electric power with respect to sensor temperature was also reviewed for comparison. First, heater electric power $u_1$ is regulated using a dummy wafer having a temperature measuring function so that the wafer temperatures $x_2$ of the center/middle/edge regions become (a) 30/30/30° C., (b) 70/70/70° C., and (c) 70/60/50° C., and the sensor temperatures $y_1$ of the center/middle/edge regions at the time are measured. The measured values were (a) 30/30/30° C., (b) 59/58/55° C., and (c) 59/52/39° C. respectively. These values were set as target values of the sensor temperature of the center/middle/edge regions to control heater electric power. The variation of sensor temperature $y_1$ at this time is shown in FIG. 10 and the variation of the measured value $x_2$ is shown in FIG. 11.

Although sensor temperature $y_1$ has reached the target value in 40 to 70 seconds after starting the process, wafer temperature $x_2$ has not yet reached the target temperature. That is, it takes a long time to control. Furthermore, in this method, each time process conditions are changed, it is necessary to adjust the heater electric power using a dummy wafer having the temperature measuring function so as to attain a desired wafer temperature and to check the sensor temperature at the time.

As described above, it is proved that wafer temperature can be controlled to a desired value quickly and accurately without having to measure and/or adjust a wafer temperature each time process conditions are changed. Also, even when there is a difference in heat conductivity between the sensor temperature measurement location/sample stage and the sample, quick temperature control without the difference is possible.

Although an example of fixing the value of constant matrix $A_{11}$ to $A_{22}$, $B_{11}$ to $B_{22}$ to one value was described in this embodiment, in a case where refrigerant temperature is substantially different or refrigerant flow rate is different, an estimated value may differ from a measured value. In such a case, if the matrix under each refrigerant condition is obtained and the matrix is switched simultaneously with the change of a refrigerant, quick and accurate control can be achieved.

Embodiment 2

With reference to the etching apparatus shown in FIG. 6, the method of performing a second wafer temperature estimation control is described according to the procedure in FIG. 2.

First, at step S2-1, the variation-with-time of wafer temperature $x_1$ and sensor temperature $y_1$ of each of the center, middle, and edge regions are measured the same as at step S1-1 in the embodiment 1. At step S2-2, heater electric power $u_1$ is incrementally increased in exactly the same time sequence as at step S2-1, and the variation of sample stage temperature $x_3$ is measured with a radiation thermometer shown in FIG. 6. At step S2-3, the relation among heater electric power $u_1$, wafer temperature $x_1$, sensor temperature $y_1$, and sample stage temperature $x_3$, which were measured at steps S2-1 and S2-2, is approximated using equation (5). Specifically, the value of a constant matrix $A_{11}$ to $A_{33}$, $B_{11}$ to $B_{31}$ is determined using the method of least squares.

Equation 5

$$\frac{d}{dt}\begin{bmatrix} y_1 \\ x_2 \\ x_3 \end{bmatrix} = \begin{bmatrix} A_{11} & A_{12} & A_{13} \\ A_{21} & A_{22} & A_{23} \\ A_{31} & A_{32} & A_{33} \end{bmatrix}\begin{bmatrix} y_1 - T_0 \\ x_2 - T_0 \\ x_3 - T_0 \end{bmatrix} + \begin{bmatrix} B_{11} \\ B_{21} \\ B_{31} \end{bmatrix} u_1 \quad (5)$$

$$y_1 = \begin{bmatrix} y_{c1} \\ y_{m1} \\ y_{e1} \end{bmatrix} : Pt\ \text{sensor temperature,}$$

$$x_2 = \begin{bmatrix} x_{c2} \\ x_{m2} \\ x_{e2} \end{bmatrix} : \text{Wafer temperature,}$$

$$x_3 = \begin{bmatrix} x_{c3} \\ x_{m3} \\ x_{e3} \end{bmatrix} : \text{Sample stage temperature}$$

$$u_1 = \begin{bmatrix} u_{c1} \\ u_{m1} \\ u_{e1} \end{bmatrix} : \text{Heater electric power,}$$

$$T_0 = \begin{bmatrix} t_0 \\ t_0 \\ t_0 \end{bmatrix} : \text{Preset temperature of refrigerant}$$

The suffixes c, m, and e represent the center, middle, and edge regions respectively.

Next at step S2-3, wafer temperature under a desired process condition is estimated using the Luenberger's states observer, based on the constant matrix $A_{11}$ to $A_{33}$, $B_{11}$ to $B_{31}$. Specifically, variables $z_2$ and $z_3$ are defined first and then the variation-with-time of $z_2$ and $z_3$ is calculated using equation (6).

Equation 6

$$\frac{d}{dt}\begin{bmatrix} z_2 \\ z_3 \end{bmatrix} = P\begin{bmatrix} z_2 - T_0 \\ z_3 - T_0 \end{bmatrix} + Q(y_1 - T_0) + P\begin{bmatrix} L_1(y_1 - T_0) \\ L_2(y_1 - T_0) \end{bmatrix} + Ru_1 \quad (6)$$

$$P = \begin{bmatrix} A_{22} - L_1 A_{12} & A_{23} - L_1 A_{13} \\ A_{32} - L_2 A_{12} & A_{33} - L_2 A_{13} \end{bmatrix}$$

$$Q = \begin{bmatrix} A_{21} - L_1 A_{11} \\ A_{31} - L_2 A_{11} \end{bmatrix},$$

$$R = \begin{bmatrix} B_{21} - L_1 B_{11} \\ B_{31} - L_2 B_{11} \end{bmatrix}$$

$$z_2 = \begin{bmatrix} z_{c2} \\ z_{m2} \\ z_{e2} \end{bmatrix},$$

$$z_3 = \begin{bmatrix} z_{c3} \\ z_{m3} \\ z_{e3} \end{bmatrix} : \text{States observer, } L_1, L_2 : \text{any 3 rows} \times 3 \text{ columns matrix}$$

The estimated value ($\tilde{x}_2$) of wafer temperature is determined from these $z_2$ and $z_3$ using equation (7).

Equation 7

$$\begin{bmatrix} \tilde{x}_2 \\ \tilde{x}_3 \end{bmatrix} = \begin{bmatrix} z_2 \\ z_3 \end{bmatrix} + \begin{bmatrix} L_1(y_1 - T_0) \\ L_2(y_1 - T_0) \end{bmatrix} \quad (7)$$

$$\tilde{x}_2 = \begin{bmatrix} \tilde{x}_{c2} \\ \tilde{x}_{m2} \\ \tilde{x}_{e2} \end{bmatrix} : \text{Estimated value of wafer temperature,}$$

$$\tilde{x}_3 = \begin{bmatrix} \tilde{x}_{c3} \\ \tilde{x}_{m3} \\ \tilde{x}_{e3} \end{bmatrix} : \text{Estimated value of sample stage surface temperature}$$

If the estimated value is calculated with $L_1$ and $L_2$ set to appropriate values, the estimated value ($\tilde{x}_2$) almost agrees with the wafer temperature when heat input from a plasma is sufficiently small. Accordingly, if an appropriate PI control is performed with respect to the estimated value ($\tilde{x}_2$), quick and accurate wafer temperature control is possible. In this embodiment, the unit matrices of equations (8) and (9) were used as the values of $L_1$ and $L_2$.

Equation 8

$$L_1 = \begin{bmatrix} 1 & 0 & 0 \\ 0 & 1 & 0 \\ 0 & 0 & 1 \end{bmatrix} \quad (8)$$

Equation 9

$$L_2 = \begin{bmatrix} 1 & 0 & 0 \\ 0 & 1 & 0 \\ 0 & 0 & 1 \end{bmatrix} \quad (9)$$

Figure 12:
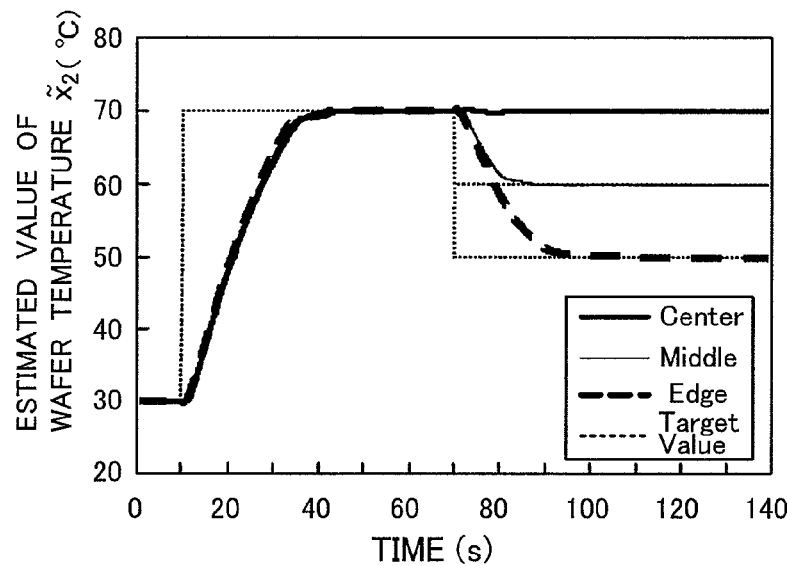
FIG. 12 is a diagram showing the variation of an estimated value of wafer temperature according to the second estimation method.
Figure 13:
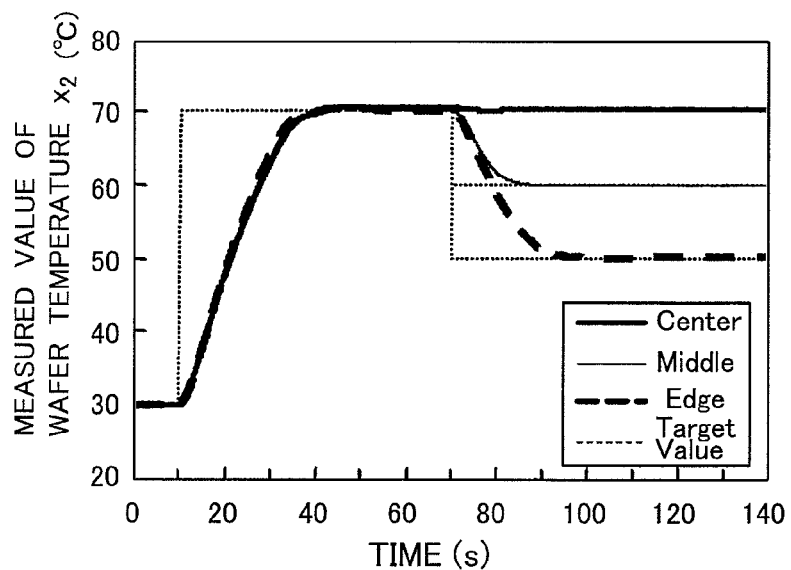
FIG. 13 is a diagram showing the variation of a measured value of wafer temperature according to the second estimation method.

Using this method, heater electric power was controlled by changing sequentially the target values of wafer temperature of the center/middle/edge regions from 30/30/30° C. to 70/70/70° C. and further to 70/60/50° C. respectively. The variation of the estimated value ($\tilde{x}_2$) of wafer temperature at the time is shown in FIG. 12 and that of the measured value $x_2$ of wafer temperature is shown in FIG. 13.

Wafer temperature varies with the variation of the estimated value ($\tilde{x}_2$), which proves that wafer temperature can be controlled to a desired value quickly. Also, it has been proved that wafer temperature can be controlled more quickly and accurately than in the first method shown in FIG. 9.

As described above, using the second wafer temperature estimation control method will allow quicker and more accurate control of wafer temperature as compared with the first wafer temperature estimation control method or any conventional method. Also, in this method, even when there is a difference in heat conductivity between the sensor temperature measurement location/the sample stage and a sample, quick temperature control without the difference is possible.

Although this embodiment was described using an example of fixing the value of matrix $A_{11}$ to $A_{33}$, $B_{11}$ to $B_{31}$ to one value, in a case where refrigerant temperature is substantially different or refrigerant flow rate is different, an estimated value may differ from a measured value. In such a case, if the matrix under each refrigerant condition is obtained and then the matrix is switched simultaneously with the change of a refrigerant, quick and accurate control can be achieved. Further, although sample stage surface temperature was measured in a vacuum in this embodiment, sufficient results can be obtained even from a measurement in the atmosphere.

Embodiment 3

With reference to the etching apparatus shown in FIG. 6, a third wafer temperature estimation control method is described according to the procedure in FIG. 3. In FIG. 6, at steps S3-1 to S3-4, the same process as in the embodiment 2 is performed and the estimated value ($\tilde{x}_2$) of wafer temperature and the estimated value ($\tilde{x}_3$) of electrode surface temperature are calculated. At step S3-5, the variation-with-time of wafer temperature $x_2$ and sensor temperature $y_1$ measured under arbitrary three kinds of plasma conditions and under different heater heating conditions. Specifically, when wafer temperature reached 30° C. after sufficient time has passed since the He pressure was regulated to 1 kPa with a wafer having the temperature measurement function being placed and attracted to the sample stage, the wafer is processed, while controlling the wafer temperature using the method of embodiment 1, under three kinds of conditions: (1) a condition under which the plasma heat input in the center region is large and a condition under which the preset temperatures of the center/middle/edge regions are controlled to 40/30/30° C., (2) a condition under which the heat input in the middle region is large and a condition under which the preset temperatures of the center/middle/edge regions are controlled to 30/40/30° C., and (3) a condition under which the heat input in the edge region is large and a condition under which the preset temperatures of the center/middle/edge regions are controlled to 30/30/40° C., and the variation of wafer temperature $x_2$ and sensor temperature $y_1$ is measured.

Next, at step S-6, the relation among wafer temperature $x_2$, sensor temperature $y_1$, the estimated value ($\tilde{x}_2$) of wafer temperature calculated using equation (7), the estimated value ($\tilde{x}_3$) of electrode temperature, and plasma heat input $u_2$ is approximated using equation (10). Specifically, a constant matrix $A_{41}$ to $A_{44}$, $B_{41}$ is determined using the method of least squares.

Equation 10

$$\frac{dx_2}{dt} = A_{41}(y_1 - T_0) + A_{42}(\tilde{x}_2 - T_0) + A_{43}(\tilde{x}_3 - T_0) + A_{44}(x_2 - T_0) + B_{42}u_2 \quad (10)$$

$$u_2 = \begin{bmatrix} u_{c2} \\ u_{m2} \\ u_{e2} \end{bmatrix} : \text{Amount of plasma heat input}$$

At this time, it is not necessary to accurately measure the amount of plasma heat input $u_2$ under each condition, and any three types of independent matrices may be used as shown in equation (1).

Equation 11

$$u_2 \text{ under condition 1} = \begin{bmatrix} 1 \\ 0 \\ 0 \end{bmatrix}, \quad (11)$$

$$u_2 \text{ under condition 2} = \begin{bmatrix} 0 \\ 1 \\ 0 \end{bmatrix},$$

$$u_2 \text{ under condition 3} = \begin{bmatrix} 0 \\ 0 \\ 1 \end{bmatrix}$$

Next, after the amount of plasma heat input $u_2$ under an actual process condition is calculated in the way described below at step S3-7, the estimated value ($\hat{x}_2$) of wafer temperature in plasma heat input is measured at step S3-8 using the Luenberger's states observer (a ^ put over x is represented as ($\hat{x}$) for convenience). Specifically, the estimated value ($\hat{x}_2$) of wafer temperature in plasma heat input is calculated using equations (12) and (13). However, the value of the amount of plasma heat input $u_2$ is changed from 0 to a value obtained at step S3-7 simultaneously at the start of plasma heat input.

Equation 12

$$\frac{dz_4}{dt} = P' \begin{bmatrix} z_2 - T_0 \\ z_3 - T_0 \\ z_4 - T_0 \end{bmatrix} + Q'(y_1 - T_0) + P' \begin{bmatrix} L_1(y_1 - T_0) \\ L_2(y_1 - T_0) \\ L_3(y_1 - T_0) \end{bmatrix} + R' \begin{bmatrix} u_1 \\ u_2 \end{bmatrix} \quad (12)$$

$$P' = [A_{42} - L_3A_{12} \ A_{43} - L_3A_{13} \ A_{44}],$$

$$Q' = A_{41} - L_3A_{11}, \ R' = [-L_3B_{11} \ B_{42}]$$

$$z_4 = \begin{bmatrix} z_{c4} \\ z_{m4} \\ z_{e4} \end{bmatrix} : \text{States observer, } L_3 : \text{any matrix of 3 rows} \times 3 \text{ columns}$$

Equation 13

$$\hat{x}_2 = z_4 + L_3 y_1 \quad (13)$$

$$\hat{x}_2 = \begin{bmatrix} \hat{x}_{c2} \\ \hat{x}_{m2} \\ \hat{x}_{e2} \end{bmatrix} \text{Estimated value of wafer temperature in}$$

the presence of plasma heat input

In this embodiment, the unit matrix of equation (14) was used as a value of $L_3$.

Equation 14

$$L_3 = \begin{bmatrix} 1 & 0 & 0 \\ 0 & 1 & 0 \\ 0 & 0 & 1 \end{bmatrix} \quad (14)$$

Next, the detail of the method of calculating the amount of plasma heat input $u_2$ under an actual process condition as shown at step S3-7 is described according to the procedure of FIG. 4.

At step S4-1, respective processes under the conditions (1), (2), and (3) described above are performed without heater control, wafer temperature and sensor temperature are measured when steady-state is reached, and the difference (amount of change) from the temperature before plasma heat input is calculated. Then, at step S4-2, a transformation matrix from sensor temperature to wafer temperature is determined by means of equation (15) using the amount of change in wafer temperature and sensor temperature.

Equation 15

$$C = \begin{bmatrix} \Delta x_{c1} & \Delta x_{c2} & \Delta x_{c3} \\ \Delta x_{m1} & \Delta x_{m2} & \Delta x_{m3} \\ \Delta x_{e1} & \Delta x_{e2} & \Delta x_{e3} \end{bmatrix} \begin{bmatrix} \Delta y_{c1} & \Delta y_{c2} & \Delta y_{c3} \\ \Delta y_{m1} & \Delta y_{m2} & \Delta y_{m3} \\ \Delta y_{e1} & \Delta y_{e2} & \Delta y_{e3} \end{bmatrix}^{-1} \quad (15)$$

$\begin{bmatrix} \Delta x_{c1} \\ \Delta x_{m1} \\ \Delta x_{e1} \end{bmatrix}$ and $\begin{bmatrix} \Delta y_{c1} \\ \Delta y_{m1} \\ \Delta y_{e1} \end{bmatrix}$ are amounts of change under condition (1) of wafer temperature and sensor temperature respectively.

$\begin{bmatrix} \Delta x_{c2} \\ \Delta x_{m2} \\ \Delta x_{e2} \end{bmatrix}$ and $\begin{bmatrix} \Delta y_{c2} \\ \Delta y_{m2} \\ \Delta y_{e2} \end{bmatrix}$ are amounts of change under condition (2) of wafer temperature and sensor temperature respectively.

$\begin{bmatrix} \Delta x_{c3} \\ \Delta x_{m3} \\ \Delta x_{e3} \end{bmatrix}$ and $\begin{bmatrix} \Delta y_{c3} \\ \Delta y_{m3} \\ \Delta y_{e3} \end{bmatrix}$ are amounts of change under condition (3) of wafer temperature and sensor temperature respectively.

Next, at step S4-3, a plasma processing is performed under a desired process condition without heater control, and the difference $\Delta y$ between sensor temperature and initial temperature is determined at the time when steady-state is reached. Then, at step S4-4, the temperature increase $\Delta x$ caused by plasma heat input is calculated from the temperature difference $\Delta y$ using equation (16).

Equation 16

$$\Delta x = C\Delta y \quad (16)$$

Increase of wafer temperature $\Delta x = \begin{bmatrix} \Delta x_c \\ \Delta x_m \\ \Delta x_e \end{bmatrix}$, Increase of sensor temperature $\Delta y = \begin{bmatrix} \Delta y_c \\ \Delta y_m \\ \Delta y_e \end{bmatrix}$ Next, at step S4-5, the increase $\Delta y$ of sensor temperature and the temperature increase $\Delta x$ due to plasma heat input are substituted in equation (10), and the amount of plasma heat input $u_2$ under a desired plasma condition is determined assuming that the left side differential term is 0.

Since wafer temperature can be accurately estimated by this method even in the presence of plasma heat input, it is possible to control wafer temperature quickly and accurately by performing an appropriate PI control on the estimated value ($\hat{x}_2$).

Figure 14:
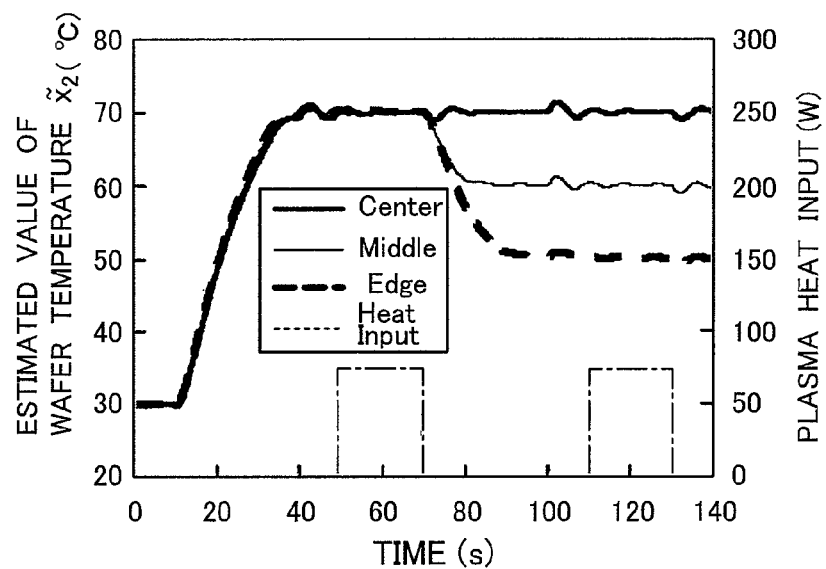
FIG. 14 is a diagram showing the variation of an estimated value of wafer temperature according to the third estimation method.
Figure 15:
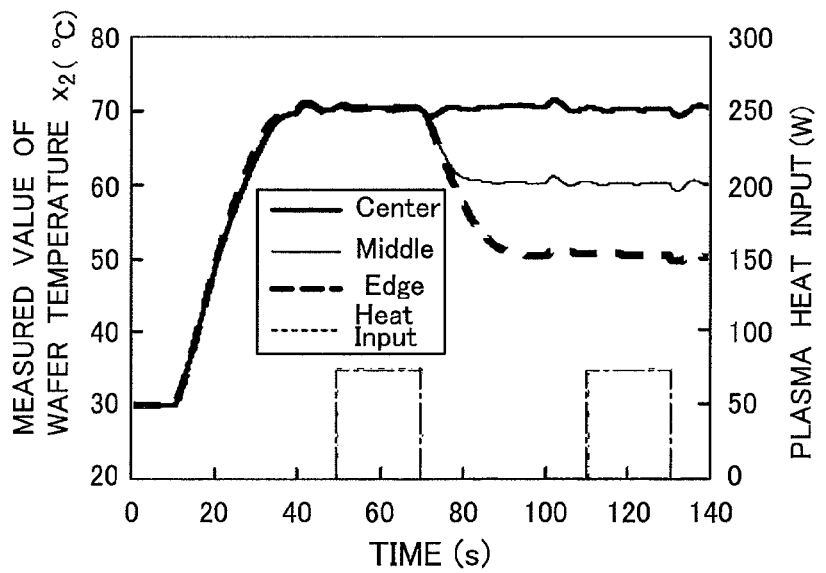
FIG. 15 is a diagram showing the variation of a measured value of wafer temperature according to the third estimation method.
Figure 16:
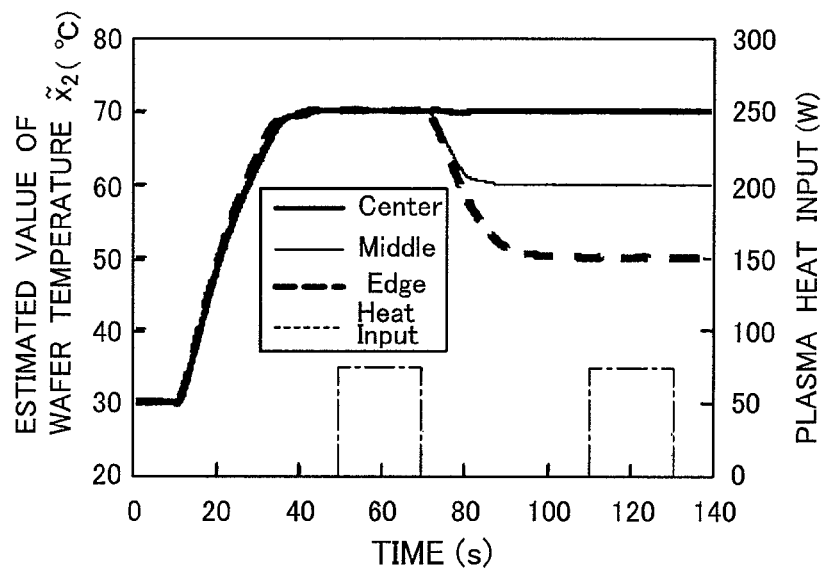
FIG. 16 is a diagram showing the variation of an estimated value with a plasma heat input according to the second estimation method.
Figure 17:
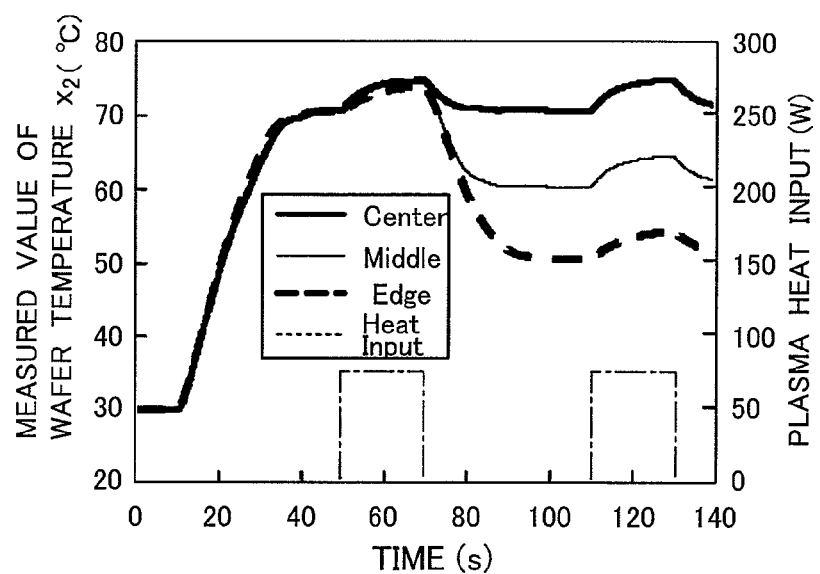
FIG. 17 is a diagram showing the variation of a measured value with a plasma heat input according to the second estimation method.
Figure 18:
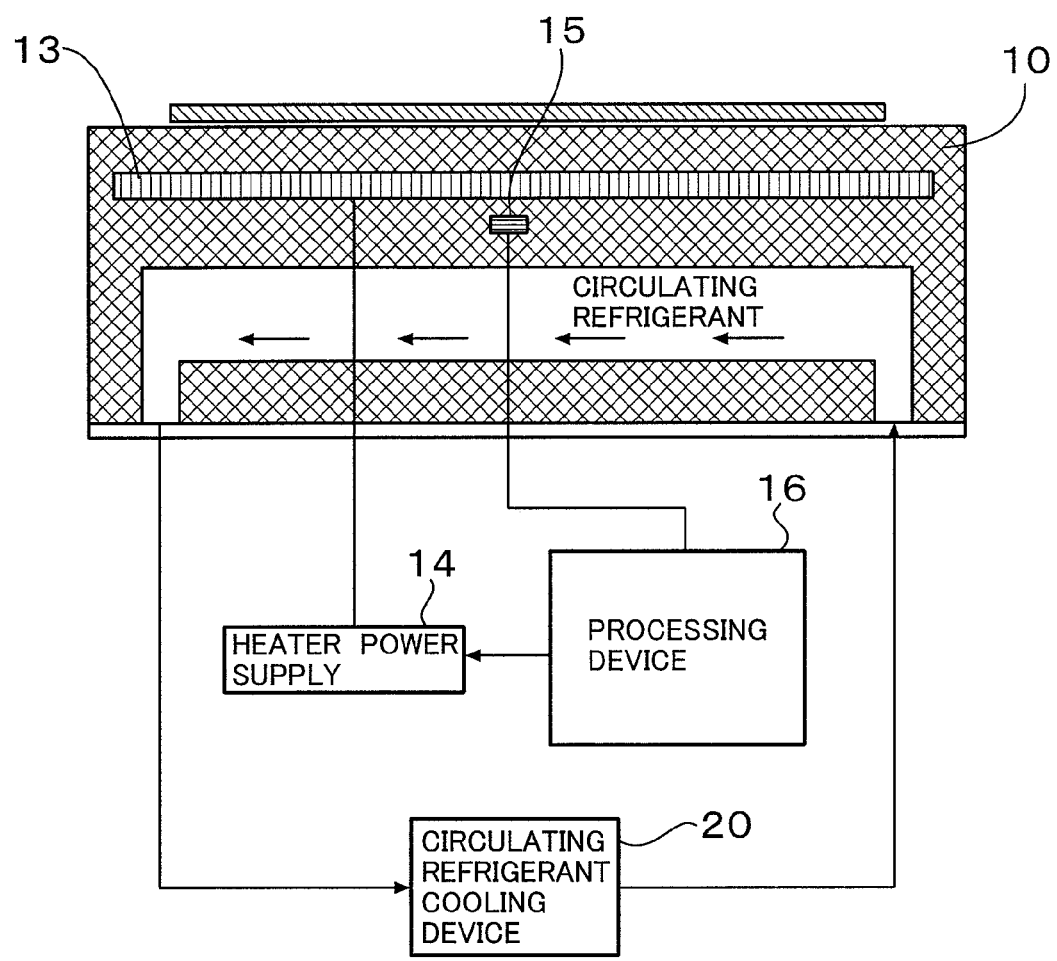
FIG. 18 is a diagram illustrating a conventional method of adjusting sample temperatures.

Using this method, the target temperatures of the center/middle/edge regions were controlled from 30/30/30° C. to 70/70/70° C. and further to 70/60/50° C. The variation of the estimated value ($\hat{x}_2$) of wafer temperature at the time is shown in FIG. 14 and that of the measured value $x_2$ of wafer temperature is shown in FIG. 15. For comparison, the variation of the estimated value ($\tilde{x}_2$) and that of the measured value $x_2$ when the control is performed using the second wafer temperature estimation control method of the present invention are shown in FIGS. 16 and 17 respectively.

In the second wafer temperature estimation control method, since the measured value $x_2$ increases above the estimated value ($\tilde{x}_2$) in plasma heat input, 50 to 70 seconds and 110 to 130 seconds after the start of the process, wafer temperature rises above the target temperature. In the third wafer temperature estimation control method, however, the measured value $x_2$ agrees with the estimated value ($\hat{x}_2$) even in the presence of plasma heat input, and therefore it is proved that wafer temperature $x_2$ can be controlled quickly and accurately by controlling the estimated value ($\hat{x}_2$). Also in this method, even when there is a difference in heat conductivity between the sensor temperature measurement location/the sample stage and the sample, a quick temperature control without the difference is possible.

Although an example of fixing the values of a matrix $A_{41}$ to $A_{44}$ and $B_{41}$ to one value was described in this embodiment, there is a case where the estimated value differs from the measured value when the temperature of a refrigerant is substantially different or the flow rate of a refrigerant is different. In such a case, if the matrix is obtained under each refrigerant condition and the matrix is switched simultaneously with the change of a refrigerant, quick and accurate control can be achieved. Furthermore, although temperature of the sample stage was measured in a vacuum in this embodiment, substantial results can be obtained even if measurement is made in the atmosphere.

As described above, according to the embodiments of the present invention, measurements of heater electric power, wafer temperature, and sensor temperature are performed; the relation among them is approximated using a simultaneous linear differential equation; wafer temperature is estimated by means of the Luenberger's states observer using the simultaneous linear differential equation; and a feedback control is performed using the estimated wafer temperature. This allows quick and stable control of wafer temperature. Also, according to the first wafer temperature estimation method, wafer temperature can be estimated accurately when plasma heat input is substantially small. Further, according to the second wafer temperature estimation method, wafer temperature can be estimated more accurately than in the first method. Further, according to the third wafer temperature estimation method, wafer temperature can be estimated accurately even in the presence of plasma heat input. If the feedback control of heater electric power is performed based on the estimated value of wafer temperature obtained in this way, it is possible to control the wafer temperature quickly and stably as described above.

What is claimed is:

1. A control method for controlling the temperature of a sample placed on a sample stage disposed in a plasma processing chamber, the sample stage including a refrigerant flow path to cool the sample stage, a heater to heat the sample stage, and a temperature sensor to measure a temperature of the sample stage, the control method comprising the steps of:

measuring, in advance of plasma processing being performed, variations-with-time of: heater electric power, temperature of the sample, and temperature of the temperature sensor;

approximating a relationship between the measured values by using a simultaneous linear differential equation;

estimating a temperature of the sample from the variation-with-time of: sensor temperature, heater electric power, and plasma heat input, by means of Luenberger states observer equations based on at least one value produced by the simultaneous linear differential equation used for the approximation; and performing a feedback control of temperature of the sample, by using the estimated temperature of the sample to perform a PI control.

2. The control method according to claim 1, further comprising the steps of:

measuring, when the temperature of the refrigerant changes value or when the flow rate of the refrigerant changes value, variation-with-time of: heater electric power, temperature of the sample, and temperature of the temperature sensor;

formulating a simultaneous linear differential equation after each change in value; and switching the simultaneous linear differential equation to be used for the Luenberger states observer equations, after each change in value of the refrigerant.

3. The control method according to claim 1, further comprising the steps of:

measuring, in the presence of plasma heat input and in the absence thereof, variation-with-time of: heater electric power, temperature of the sample, and temperature of the temperature sensor;

estimating a temperature of the sample by using a relationship between them; and performing a feedback control of temperature of the sample, by using the estimated temperature of the sample to perform a PI control.

4. The control method of claim 1,
wherein the simultaneous linear differential equation includes:

$$\frac{d}{dt}\begin{bmatrix} y_1 \\ x_2 \end{bmatrix} = \begin{bmatrix} A_{11} & A_{12} \\ A_{21} & A_{22} \end{bmatrix}\begin{bmatrix} y_1 - T_0 \\ x_2 - T_0 \end{bmatrix} + \begin{bmatrix} B_{11} \\ B_{21} \end{bmatrix} u_1;$$

wherein $x_2$, $y_1$, $u_1$, and $T_0$ are defined as follows, and wherein suffixes c, m, and e represent the center, middle, and edge regions respectively:

$$y_1 = \begin{bmatrix} y_{c1} \\ y_{m1} \\ y_{e1} \end{bmatrix} : \text{Sensor temperature,}$$

$$x_2 = \begin{bmatrix} x_{c2} \\ x_{m2} \\ x_{e2} \end{bmatrix} : \text{Temperature of the sample,}$$

$$u_1 = \begin{bmatrix} u_{c1} \\ u_{m1} \\ u_{e1} \end{bmatrix} : \text{Heater electric power,}$$

$$T_0 = \begin{bmatrix} t_0 \\ t_0 \\ t_0 \end{bmatrix} : \text{Preset temperature of refrigerant;}$$

and wherein the values of respective elements of constant matrices $A_{11}$ to $A_{22}$ and $B_{11}$ to $B_{22}$ are determined using the method of least squares.

5. The control method of claim 4,
wherein the Luenberger states observer equations include:

$$\frac{dz_2}{dt} = P(z_2 - T_0) + Q(y_1 - T_0) + PL(y_1 - T_0) + Ru_1 \text{ and}$$

$$P = (A_{22} - LA_{12}), Q = (A_{21} - LA_{11}), R = (B_{21} - LB_{11}); \quad \text{wherein}$$

$$z_2 = \begin{bmatrix} z_{c2} \\ z_{m2} \\ z_{e2} \end{bmatrix} : \text{States observer, and } L : \text{any matrix of 3 rows} \times 3 \text{ columns;}$$

wherein from the values of variable $z_2$ that are calculated in the Luenberger states observer equations, an estimated temperature of the sample ($\tilde{x}_2$) is determined with the following equations:

$$\tilde{x}_2 = z_2 + L(y_1 - T_0), \text{ and}$$

$$\tilde{x}_2 = \begin{bmatrix} \tilde{x}_{c2} \\ \tilde{x}_{m2} \\ \tilde{x}_{e2} \end{bmatrix} : \text{Estimated value of wafer temperature;}$$

wherein the following unit matrix is used as the valve of $L$:

$$L = \begin{bmatrix} 1 & 0 \\ 0 & 1 \end{bmatrix}.$$

6. A control method for controlling temperature of a sample placed on a sample stage disposed in a plasma processing chamber, the sample stage including a refrigerant flow path to cool the sample stage, a heater to heat the sample stage, and a temperature sensor to measure a temperature of the sample stage, the control method comprising the steps of:

measuring, in advance of plasma processing being performed, variation-with-time of: heater electric power, temperature of the sample, temperature of the temperature sensor, and temperature of a surface of the sample stage;

approximating a relationship between the measured values by using a simultaneous linear differential equation;

estimating a temperature of the sample from the variation-with-time of: sensor temperature, heater electric power, and plasma heat input, by means of Luenberger states observer equations based on at least one value produced by the simultaneous linear differential equation used for the approximation; and performing a feedback control of temperature of the sample, by using the estimated temperature of the sample to perform a PI control.

7. The control method according to claim 6, further comprising the steps of:
- measuring, when the temperature of the refrigerant changes value or when the flow rate of the refrigerant changes value, variation-with-time of: heater electric power, temperature of the sample, and temperature of the temperature sensor;
- formulating a simultaneous linear differential equation after each change in value; and
- switching the simultaneous linear differential equation to be used for Luenberger states observer equations, after each change in value of temperature or flow rate of the refrigerant.

8. The control method of claim 6,
wherein variation of a sample stage temperature is measured;
wherein the simultaneous linear differential equation includes:

$$\frac{d}{dt}\begin{bmatrix} y_1 \\ x_2 \\ x_3 \end{bmatrix} = \begin{bmatrix} A_{11} & A_{12} & A_{13} \\ A_{21} & A_{22} & A_{23} \\ A_{31} & A_{32} & A_{33} \end{bmatrix}\begin{bmatrix} y_1 - T_0 \\ x_2 - T_0 \\ x_3 - T_0 \end{bmatrix} + \begin{bmatrix} B_{11} \\ B_{21} \\ B_{31} \end{bmatrix} u_1, \text{ wherein}$$

$$y_1 = \begin{bmatrix} y_{c1} \\ y_{m1} \\ y_{e1} \end{bmatrix}: \text{Sensor temperature,}$$

$$x_2 = \begin{bmatrix} x_{c2} \\ x_{m2} \\ x_{e2} \end{bmatrix}: \text{Temperature of the sample,}$$

$$x_3 = \begin{bmatrix} x_{c3} \\ x_{m3} \\ x_{e3} \end{bmatrix}: \text{Sample stage temperature,}$$

$$u_1 = \begin{bmatrix} u_{c1} \\ u_{m1} \\ u_{e1} \end{bmatrix}: \text{Heater electric power, and}$$

$$T_0 = \begin{bmatrix} t_0 \\ t_0 \\ t_0 \end{bmatrix}: \text{Preset temperature of refrigerant,}$$

wherein suffixes c, m, and e represent the center, middle, and edge regions respectively; and
wherein the value of a constant matrix $A_{11}$ to $A_{33}$ and $B_{11}$ to $B_{31}$ is determined using the method of least squares.

9. The control method of claim 8,
wherein the Luenberger states observer equations include:

$$\frac{d}{dt}\begin{bmatrix} z_2 \\ z_3 \end{bmatrix} = P\begin{bmatrix} z_2 - T_0 \\ z_3 - T_0 \end{bmatrix} + Q(y_1 - T_0) + P\begin{bmatrix} L_1(y_1 - T_0) \\ L_2(y_1 - T_0) \end{bmatrix} + Ru_1, \text{ wherein}$$

$$P = \begin{bmatrix} A_{22} - L_1 A_{12} & A_{23} - L_1 A_{13} \\ A_{32} - L_2 A_{12} & A_{33} - L_2 A_{13} \end{bmatrix},$$

$$Q = \begin{bmatrix} A_{21} - L_1 A_{11} \\ A_{31} - L_2 A_{11} \end{bmatrix}, R = \begin{bmatrix} B_{21} - L_1 B_{11} \\ B_{31} - L_2 B_{11} \end{bmatrix},$$

$$z_2 = \begin{bmatrix} z_{c2} \\ z_{m2} \\ z_{e2} \end{bmatrix}, \text{ and } z_3 = \begin{bmatrix} z_{c3} \\ z_{m3} \\ z_{e3} \end{bmatrix}: \text{States observer,}$$

$L_1, L_2$: any 3 rows × 3 columns matrix;

wherein from the values of variables $z_2$ and $z_3$ that are calculated in the Luenberger states observer equations, an estimated temperature of the sample ($\tilde{x}_2$) is determined using the following equation:

$$\begin{bmatrix} \tilde{x}_2 \\ \tilde{x}_3 \end{bmatrix} = \begin{bmatrix} z_2 \\ z_3 \end{bmatrix} + \begin{bmatrix} L_1(y_1 - T_0) \\ L_2(y_1 - T_0) \end{bmatrix}, \text{ wherein}$$

$$\tilde{x}_2 = \begin{bmatrix} \tilde{x}_{c2} \\ \tilde{x}_{m2} \\ \tilde{x}_{e2} \end{bmatrix}: \text{Estimated value of wafer temperature, and}$$

$$\tilde{x}_3 = \begin{bmatrix} \tilde{x}_{c3} \\ \tilde{x}_{m3} \\ \tilde{x}_{e3} \end{bmatrix}: \text{Estimated value of sample stage surface temperature; and}$$

wherein the following unit matrices are used as the value of $L_1$ and $L_2$:

$$L_1 = \begin{bmatrix} 1 & 0 & 0 \\ 0 & 1 & 0 \\ 0 & 0 & 1 \end{bmatrix}, \text{ and } L_2 = \begin{bmatrix} 1 & 0 & 0 \\ 0 & 1 & 0 \\ 0 & 0 & 1 \end{bmatrix}.$$

10. A control method for controlling temperature of a sample placed on a sample stage disposed in a plasma processing chamber, the sample stage including a refrigerant flow path to cool the sample stage, a heater to heat the sample stage, and a temperature sensor to measure temperature of the sample stage, the control method comprising the steps of:
- measuring, in the presence of plasma heat input and in the absence thereof, variation-with-time of: heater electric power, temperature of the sample, and temperature of the temperature sensor;
- approximating, for measurement results in the absence of plasma heat input, a relationship between heater electric power, temperature of the sample, and temperature of the sensor by using a first simultaneous linear differential equation;
- calculating a first estimated value of the temperature of the sample, by means of Luenberger states observer equations based on at least one value produced by the first simultaneous linear differential equation;
- approximating, for measurement results both in the presence of plasma heat input and in the absence thereof, a relationship between the calculated first estimated value, sensor temperature, temperature of the sample, heater electric power, and plasma heat input by using a second simultaneous linear differential equation;
- estimating a second estimated value temperature of the sample, from the variation-with-time of the first estimated value, sensor temperature, heater electric power, and plasma heat input, by means of Luenberger states observer equations based on at least one value produced by the second simultaneous linear differential equation; and
- performing a feedback control by using the estimated temperature of the sample.

11. The control method according to claim 10, further comprising the steps of:
- performing a plasma processing;
- measuring a steady-state value of temperature of the sample; and
- substituting the steady-state value in the second differential equation, while assuming that the differential term is zero, to calculate a plasma heat input.

12. The control method according to claim 10, further comprising the steps of:
  performing a plasma processing;
  measuring a relationship between steady-state values of sensor temperature and temperature of the sample, assuming that a heater electric power is zero;
  approximating a first relationship between steady-state values of sensor temperature and temperature of the sample by using the first simultaneous linear differential equation;
  performing a desired plasma processing;
  measuring a second steady-state value of sensor temperature, assuming a heater electric power is zero;
  estimating a second steady-state value of temperature of the sample, from the first simultaneous linear differential equation and the second steady-state value of sensor temperature, for the desired plasma processing; and
  substituting the second steady-state value in the second differential equation assuming that the differential term thereof is zero, to calculate a plasma heat input.

13. The control method of claim 6,
  wherein the first simultaneous linear differential equation includes:

$$\frac{d}{dt}\begin{bmatrix} y_1 \\ x_2 \end{bmatrix} = \begin{bmatrix} A_{11} & A_{12} \\ A_{21} & A_{22} \end{bmatrix}\begin{bmatrix} y_1 - T_0 \\ x_2 - T_0 \end{bmatrix} + \begin{bmatrix} B_{11} \\ B_{21} \end{bmatrix} u_1;$$

wherein $x_2$, $y_1$, $u_1$, and $T_0$ are defined as follows, and wherein suffixes c, m, and e represent the center, middle, and edge regions respectively:

$$y_1 = \begin{bmatrix} y_{c1} \\ y_{m1} \\ y_{e1} \end{bmatrix} : \text{Sensor temperature},$$

$$x_2 = \begin{bmatrix} x_{c2} \\ x_{m2} \\ x_{e2} \end{bmatrix} : \text{Temperature of the sample},$$

$$u_1 = \begin{bmatrix} u_{c1} \\ u_{m1} \\ u_{e1} \end{bmatrix} : \text{Heater electric power},$$

$$T_0 = \begin{bmatrix} t_0 \\ t_0 \\ t_0 \end{bmatrix} : \text{Preset temperature of refrigerant};$$

and wherein the values of respective elements of constant matrices $A_{11}$ to $A_{22}$ and $B_{11}$ to $B_{22}$ are determined using the method of least squares.

14. The control method of claim 13,
  wherein the Luenberger states observer equations for the first simultaneous linear differential equation include:

$$\frac{dz_2}{dt} = P(z_2 - T_0) + Q(y_1 - T_0) + PL(y_1 - T_0) + Ru_1 \text{ and}$$

$P = (A_{22} - LA_{12})$, $Q = (A_{21} - LA_{11})$, $R = (B_{21} - LB_{11})$; wherein $$z_2 = \begin{bmatrix} z_{c2} \\ z_{m2} \\ z_{e2} \end{bmatrix} : \text{States observer, and}$$

L: any matrix of 3 rows × 3 columns, wherein from the values of variable $z_2$ that are calculated in the Luenberger states observer equations, an estimated temperature of the sample ($\tilde{x}_2$) is determined with the following equations:

$$\tilde{x}_2 = z_2 + L(y_1 - T_0), \text{ and}$$

$$\tilde{x}_2 = \begin{bmatrix} \tilde{x}_{c2} \\ \tilde{x}_{m2} \\ \tilde{x}_{e2} \end{bmatrix} : \text{Estimated value of wafer temperature};$$

wherein the following unit matrix is used as the value of L:

$$L = \begin{bmatrix} 1 & 0 \\ 0 & 1 \end{bmatrix}.$$

15. The control method of claim 14,
  wherein variation of a sample stage temperature is measured;
  wherein the second simultaneous linear differential equation includes:

$$\frac{d}{dt}\begin{bmatrix} y_1 \\ x_2 \\ x_3 \end{bmatrix} = \begin{bmatrix} A_{11} & A_{12} & A_{13} \\ A_{21} & A_{22} & A_{23} \\ A_{31} & A_{32} & A_{33} \end{bmatrix}\begin{bmatrix} y_1 - T_0 \\ x_2 - T_0 \\ x_3 - T_0 \end{bmatrix} + \begin{bmatrix} B_{11} \\ B_{21} \\ B_{31} \end{bmatrix} u_1, \text{ wherein}$$

$$y_1 = \begin{bmatrix} y_{c1} \\ y_{m1} \\ y_{e1} \end{bmatrix} : \text{Sensor temperature},$$

$$x_2 = \begin{bmatrix} x_{c2} \\ x_{m2} \\ x_{e2} \end{bmatrix} : \text{Temperature of the sample},$$

$$x_3 = \begin{bmatrix} x_{c3} \\ x_{m3} \\ x_{e3} \end{bmatrix} : \text{Sample stage temperature},$$

$$u_1 = \begin{bmatrix} u_{c1} \\ u_{m1} \\ u_{e1} \end{bmatrix} : \text{Heater electric power, and}$$

$$T_0 = \begin{bmatrix} t_0 \\ t_0 \\ t_0 \end{bmatrix} : \text{Preset temperature of refrigerant};$$

wherein suffixes c, m, and e represent the center, middle, and edge regions respectively: and
wherein the value of a constant matrix $A_{11}$ to $A_{33}$ and $B_{11}$ to $B_{31}$ is determined using the method of least squares.

16. The control method of claim 15,
  wherein the Luenberger states observer equations for the second simultaneous linear differential equation include:

$$\frac{d}{dt}\begin{bmatrix} z_2 \\ z_3 \end{bmatrix} = P\begin{bmatrix} z_2 - T_0 \\ z_3 - T_0 \end{bmatrix} + Q(y_1 - T_0) + P\begin{bmatrix} L_1(y_1 - T_0) \\ L_2(y_1 - T_0) \end{bmatrix} + Ru_1,$$

$$P = \begin{bmatrix} A_{22} - L_1 A_{12} & A_{23} - L_1 A_{13} \\ A_{32} - L_2 A_{12} & A_{33} - L_2 A_{13} \end{bmatrix}, Q = \begin{bmatrix} A_{21} - L_1 A_{11} \\ A_{31} - L_2 A_{11} \end{bmatrix},$$

-continued $$R = \begin{bmatrix} B_{21} - L_1 B_{11} \\ B_{31} - L_2 B_{11} \end{bmatrix}, z_2 = \begin{bmatrix} z_{c2} \\ z_{m2} \\ z_{e2} \end{bmatrix}, \text{ and}$$

$$z_3 = \begin{bmatrix} z_{c3} \\ z_{m3} \\ z_{e3} \end{bmatrix}: \text{States observer,}$$

$L_1, L_2$: any 3 rows × 3 columns matrix;

wherein from the values of variables $z_2$ and $z_3$ that are calculated in the Luenberger states observer equations, an estimated temperature of the sample ($\tilde{x}_2$) is determined using the following equation:

$$\begin{bmatrix} \tilde{x}_2 \\ \tilde{x}_3 \end{bmatrix} = \begin{bmatrix} z_2 \\ z_3 \end{bmatrix} + \begin{bmatrix} L_1(y_1 - T_0) \\ L_2(y_1 - T_0) \end{bmatrix}, \text{ wherein}$$

$$\tilde{x}_2 = \begin{bmatrix} \tilde{x}_{c2} \\ \tilde{x}_{m2} \\ \tilde{x}_{e2} \end{bmatrix}: \text{Estimated value of wafer temperature, and}$$

$$\tilde{x}_3 = \begin{bmatrix} \tilde{x}_{c3} \\ \tilde{x}_{m3} \\ \tilde{x}_{e3} \end{bmatrix}: \text{Estimated value of sample stage surface temperature; and}$$

wherein the following unit matrices are used as the value of $L_1$ and $L_2$:

$$L_1 = \begin{bmatrix} 1 & 0 & 0 \\ 0 & 1 & 0 \\ 0 & 0 & 1 \end{bmatrix}, \text{ and } L_2 = \begin{bmatrix} 1 & 0 & 0 \\ 0 & 1 & 0 \\ 0 & 0 & 1 \end{bmatrix}.$$

17. The control method of claim 16,
wherein when temperature of the sample reaches 30° C. for a predetermined amount of time, the sample is processed while controlling the temperature of the sample, under one of three conditions:

(1) a condition under which the plasma heat input in the center region is large and a condition under which the preset temperatures of the center/middle/edge regions are controlled to 40/30/30°, respectively, (2) a condition under which the heat input in the middle region is large and a condition under which the preset temperatures of the center/middle/edge regions are controlled to 30/40/30° C., respectively, and (3) a condition under which the heat input in the edge region is large and a condition under which the preset temperatures of the center/middle/edge regions are controlled to 30/30/40° C., the variation of a temperature of a sample ($x_2$), and sensor temperature ($y_1$) is measured;

wherein the relationship between the temperature of the sample ($x_2$), sensor temperature ($y_1$), estimated value ($\tilde{x}_2$) of the temperature of the sample, estimated value of the sample stage surface temperature ($\tilde{x}_3$), and plasma heat input ($u_2$) are approximated using the following equation:

$$\frac{dx_2}{dt} = A_{41}(y_1 - T_0) + A_{42}(\tilde{x}_2 - T_0) + A_{43}(\tilde{x}_3 - T_0) + A_{44}(x_2 - T_0) + B_{42}u_2,$$

wherein $$u_2 = \begin{bmatrix} u_{c2} \\ u_{m2} \\ u_{e2} \end{bmatrix}: \text{Amount of plasma heat input;}$$

wherein a constant matrix $A_{41}$ to $A_{44}$ and $B_{41}$ is determined using the method of least squares; and wherein it is not necessary to accurately measure the amount of plasma heat input $u_2$, because under each condition, the respective one of the following three types of independent matrices is used:

$$u_2 \text{ under condition } 1 = \begin{bmatrix} 1 \\ 0 \\ 0 \end{bmatrix}, u_2 \text{ under condition } 2 = \begin{bmatrix} 0 \\ 1 \\ 0 \end{bmatrix},$$

$$u_2 \text{ under condition } 3 = \begin{bmatrix} 0 \\ 0 \\ 1 \end{bmatrix}.$$

18. The control method of claim 17,
wherein after the amount of plasma heat input $u_2$ under an actual process condition is calculated, the estimated value ($\hat{x}_2$) of the temperature of the sample in plasma heat input is measured using the following Luenberger states observer equations:

$$\frac{dz_4}{dt} = P' \begin{bmatrix} z_2 - T_0 \\ z_3 - T_0 \\ z_4 - T_0 \end{bmatrix} + Q'(y_1 - T_0) + P' \begin{bmatrix} L_1(y_1 - T_0) \\ L_2(y_1 - T_0) \\ L_3(y_1 - T_0) \end{bmatrix} + R' \begin{bmatrix} u_1 \\ u_2 \end{bmatrix}, \text{ and}$$

$$P' = [A_{42} - L_3 A_{12} A_{43} - L_3 A_{13} A_{44}],$$

$$Q' = A_{41} - L_3 A_{11}, R' = [-L_3 B_{11} B_{42}],$$

$$z_4 = \begin{bmatrix} z_{c4} \\ z_{m4} \\ z_{e4} \end{bmatrix}: \text{States observer,}$$

$L_3$: any matrix of 3 rows × 3 columns; and $\hat{x}_2 = z_4 + L_3 y_1$, wherein $$\hat{x}_2 = \begin{bmatrix} \hat{x}_{c2} \\ \hat{x}_{m2} \\ \hat{x}_{e2} \end{bmatrix} \text{ Estimated value of wafer temperature in the}$$

presence of the plasma heat input;

wherein the value of the amount of plasma heat input $u_2$ is changed from zero to a value obtained simultaneously at the start of plasma heat input;

wherein the following unit matrix is used as a value of $L_3$:

$$L_3 = \begin{bmatrix} 1 & 0 & 0 \\ 0 & 1 & 0 \\ 0 & 0 & 1 \end{bmatrix}.$$

19. The control method of claim 18,
wherein a transformation matrix from sensor temperature to temperature of the sample is determined by using the following equation, using the amount of change in temperature of the sample and sensor temperature:

$$C = \begin{bmatrix} \Delta x_{c1} & \Delta x_{c2} & \Delta x_{c3} \\ \Delta x_{m1} & \Delta x_{m2} & \Delta x_{m3} \\ \Delta x_{e1} & \Delta x_{e2} & \Delta x_{e3} \end{bmatrix} \begin{bmatrix} \Delta y_{c1} & \Delta y_{c2} & \Delta y_{c3} \\ \Delta y_{m1} & \Delta y_{m2} & \Delta y_{m3} \\ \Delta y_{e1} & \Delta y_{e2} & \Delta y_{e3} \end{bmatrix}^{-1} \text{ wherein}$$

$\begin{bmatrix} \Delta x_{c1} \\ \Delta x_{m1} \\ \Delta x_{e1} \end{bmatrix}$ and $\begin{bmatrix} \Delta y_{c1} \\ \Delta y_{m1} \\ \Delta y_{e1} \end{bmatrix}$ are amounts of change under condition (1) of temperature of the sample and sensor temperature respectively, $\begin{bmatrix} \Delta x_{c2} \\ \Delta x_{m2} \\ \Delta x_{e2} \end{bmatrix}$ and $\begin{bmatrix} \Delta y_{c2} \\ \Delta y_{m2} \\ \Delta y_{e2} \end{bmatrix}$ are amounts of change under condition (2) of temperature of the sample and sensor temperature respectively, $\begin{bmatrix} \Delta x_{c3} \\ \Delta x_{m3} \\ \Delta x_{e3} \end{bmatrix}$ and $\begin{bmatrix} \Delta y_{c3} \\ \Delta y_{m3} \\ \Delta y_{e3} \end{bmatrix}$ are amounts of change under condition (3) of temperature of the sample and sensor temperature respectively . temperature of the sample and sensor temperature respectively.

20. The control method of claim 18,
wherein the increase in temperature of the sample ($\Delta x$) caused by plasma heat input is calculated from the increase in sensor temperature ($\Delta y$), by using the following equation:

$$\Delta x = C \cdot \Delta y \text{ wherein}$$

$$\text{Increase of wafer temperature } \Delta x = \begin{bmatrix} \Delta x_c \\ \Delta x_m \\ \Delta x_e \end{bmatrix},$$

$$\text{Increase of sensor temperature } \Delta y = \begin{bmatrix} \Delta y_c \\ \Delta y_m \\ \Delta y_e \end{bmatrix}.$$

* * * * *